United States Patent [19]

Steen et al.

[11] Patent Number: 4,623,752
[45] Date of Patent: Nov. 18, 1986

[54] DOUBLE-ACTION GASKET ASSEMBLY FOR EMI/RFI SHIELDING

[75] Inventors: Grant F. Steen, Bryn Athyn, Pa.; Michael Holloway, Maple Shade, N.J.

[73] Assignee: Burroughs Corporation, Detroit, Mich.

[21] Appl. No.: 685,400

[22] Filed: Dec. 24, 1984

[51] Int. Cl.[4] .............................................. H05K 9/00
[52] U.S. Cl. ................................ 174/35 GC; 24/289; 174/35 R; 174/35 MS; 277/189; 277/901
[58] Field of Search ................................ 277/189, 901; 174/35 GC, 35 R, 35 MS, 36; 24/294, 289, 297, 293; 49/482, 484, 493, 494

[56] References Cited

U.S. PATENT DOCUMENTS

| | | | |
|---|---|---|---|
| 1,675,790 | 7/1928 | Carr | 24/289 |
| 2,240,491 | 5/1941 | Crowe | 24/294 |
| 2,287,606 | 6/1942 | Eady | 24/294 X |
| 2,659,950 | 11/1953 | West | 24/293 |
| 2,784,814 | 3/1957 | Bright | 24/293 X |
| 2,786,249 | 3/1957 | Poupitch | 24/293 |
| 2,932,866 | 4/1960 | Fernberg | 24/294 |
| 3,277,230 | 10/1966 | Stickney et al. | 174/35 GC |
| 3,304,360 | 2/1967 | Hadley et al. | 277/901 X |
| 3,504,095 | 3/1970 | Roberson et al. | 277/901 X |
| 3,594,490 | 7/1971 | Mitchell et al. | 174/35 GC X |

*Primary Examiner*—Allan N. Shoap
*Attorney, Agent, or Firm*—Francis A. Varallo; Mervyn L. Young; Kevin R. Peterson

[57] ABSTRACT

The present disclosure describes an elongated, articulated gasket assembly which finds particular application in the EMI/RFI shielding of the gaps between adjacent panels of a metal cabinet, such as that used in a mainframe computer. The gasket assembly is characterized by its double-action capability, that is, it may be wiped in either direction under a compressive force, without sustaining any damage. Likewise, the gasket assembly exhibits excellent durability during the routine handling of the panels. Finally, since installation of the present gasket assembly does not restrict movement of the panels, a desired panel may be removed during service procedures without affecting any other panel.

7 Claims, 6 Drawing Figures

DOUBLE-ACTION GASKET ASSEMBLY FOR EMI/RFI SHIELDING

BACKGROUND OF THE INVENTION

In the operation of electronic equipment, it is necessary to shield against electromagnetic emissions. When the equipment is housed in metal cabinets, as is the case, for example, with a mainframe computer, the gaps between the panels which enclose a side of the cabinet, pose an EMI/RFI shielding problem.

In order to shield the gaps between adjacent panels or between a panel and the cabinet housing, there are presently available from different manufacturers gasket-like shields. One such manufacturer is Instrument Specialties Company, Inc., which offers two types of beryllium-copper finger contact strips sold under the trademark "Sticky Fingers" and identified in the advertising literature with U.S. Pat. No. 3,504,095. In the first-type strip, an adhesively coated section supports one end of each of the arched fingers, the other end of which is unsupported and free to move. In performing a shielding function, the gasket must be either directly compressed by the mating surfaces by a force directed perpendicularly to the gasket as with a panel pressed against the housing frame, or compressed with a wiping action by a force directed laterally to the gasket as occurs in the gap between adjacent coplanor panels when one panel is moved in a direction substantially orthogonal to its planar surface into position relative to an adjacent panel. The difficulty with the last mentioned commercial gasket is that the fingers are fragile and are designed to be wiped in only one direction—from their supported ends toward their free ends. If mounted between adjacent panels, extreme care must be exercised when removing a panel, because manual contact with the shielding fingers in a direction opposite to the wiping direction will severely damage the fingers and compromise the integrity of the shield. To preclude such damage, a flange may be provided on a panel edge within the gap area which may be grasped during panel removal, thereby protecting the gasket fingers. The flange is also necessary if a direct compression mode is used since the gasket would normally be mounted on the flange. Use of such a flange is undesirable since it restricts the movement of the panels. Thus, it may be necessary to open an adjoining panel before a panel with a flange may be opened. To open multiple panels to access a particular location in the cabinet can become time consuming for the service personnel. Moreover, the cost of the cabinet is increased since, for example, in the case of lift-off panels, it may be necessary to fabricate and stock several panel types to achieve the desired cabinet configuration.

As was mentioned hereinbefore, the manufacturer of "Sticky Fingers" offers a second type of gasket described in its advertising literature as the newest version. This second type was designed to be less susceptible to damage than the first type. As indicated in the literature, it includes a U-shaped end as part of the adhesively coated longitudinal section, which is adapted to retain the free movable end of the fingers when the enclosure doors are open, so as to protect against accidental damage to the strip's fingers. While offering some improvement relative to the first type of gasket, the second type is still adapted to be wiped in only one direction. If the gasket is grasped in a direction opposite to the wiping direction, during panel removal, the fingers tend to exit the U-shaped retainers and to be bent backward and damaged. Thus, it has been expedient to mount even the second type of gasket on panels which have a protective flange as described hereinbefore. Accordingly, the restrictions on panel removal still apply.

What is desirable is an EMI/RFI shielding gasket which may be installed on the panels of a cabinet structure without a flange and the accompanying restriction of panel movement; which may be compressively wiped in either lateral direction; which is more durable than those described herein; and which is relatively immune to damage from normal handling of the panels during service procedures. The double-action gasket assembly of the present invention fills such a need.

SUMMARY OF THE INVENTION

In accordance with the present invention there is provided a double-action gasket assembly comprised of a one piece elongated, articulated beryllium copper structure and a substantially planar stainless steel carrier enclosed thereby.

More specifically, as seen in cross section, the segments of the beryllium copper structure comprise an arcuate section having opposed extremities bent toward each other to form a respective pair of spaced-apart, coplanar sections. The carrier is disposed within the bends of the structure and is contiguous with the surfaces of the pair of coplanar sections. The carrier provides a means for attaching the gasket to a mounting surface such as the edge of a panel. At the same time, the carrier surface is designed to be slightly offset from the adjacent mounting surface, in order to permit the beryllium copper structure to slide against the last mentioned surface without interference by the carrier. Also, the structure is loosely mounted on the carrier to permit the pair of coplanar sections to contact the mounting surface and to slide in either direction thereon in response to the compressive wiping of its arcuate section, without incurring damage. At the same time, the attachment is firm enough to keep the structure from coming loose from the carrier when the mounting surface is routinely handled.

Other features and advantages of the present shielding gasket assembly will become apparent in the detailed description thereof which follows.

DESCRIPTION OF THE PREFERRED EMBODIMENT

Figure 1:
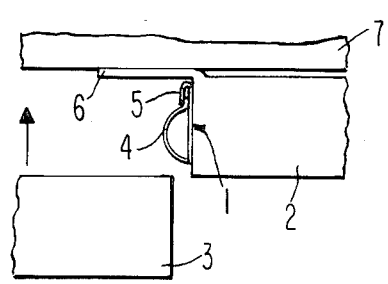
FIG. 1 is a prior art single-action shielding gasket mounted on a panel having a protective flange.
Figure 4:
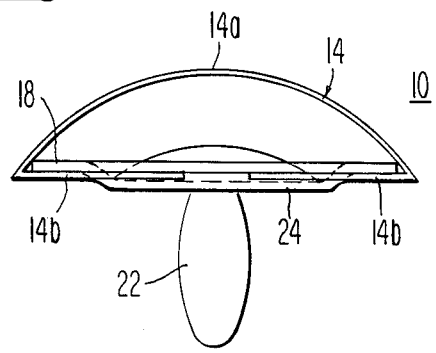
FIG. 4 is an end view of the assembly of FIG. 2.

FIG. 1 illustrates the prior art "Sticky Fingers" shielding gasket 1 installed on the edge of the panel 2 and adapted to be compressively wiped in the direction of the arrow by the adjacent panel 3, thereby shielding the gap formed between the panels. Under compression, the extremity of finger 4 of the gasket 1 moves within the U-shaped enclosure 5. However, should it be necessary to remove panel 2, it is apparent that in the absence of flange 6, the panel would normally be grasped along the edge upon which gasket 1 is installed. Movement of the panel 2 in a direction away from frame 7, may involve contact with the finger 4 which dislodges it from the U-shaped enclosure 5 and bends it backward, thereby damaging the gasket seal. Flange 6 provides a hand hold for the panel 2 which minimizes the need for manual contact with the gasket 1. On the other hand, flange 6 restricts movement of the panels 2 and 3. If it is necessary to remove panel 2, panel 3 must first be removed, because of the flange interference.

FIGS. 2, 3, 4 and 6 illustrate respectively plan, side, end view and section view of the double-action gasket assembly 10 of the present invention. With general reference to the last mentioned figures, an actual operative embodiment of the assembly 10 is comprised of a unitary elongated, articulated beryllium copper structure 12 and a substantially planar stainless steel carrier 18 enclosed thereby. It should be understood that the various materials identified herein as being used in the assembly 10, the physical dimensions of the materials, and other parameters are provided solely for purposes of example, and the invention is not to be construed as being limited thereto.

Figure 2:
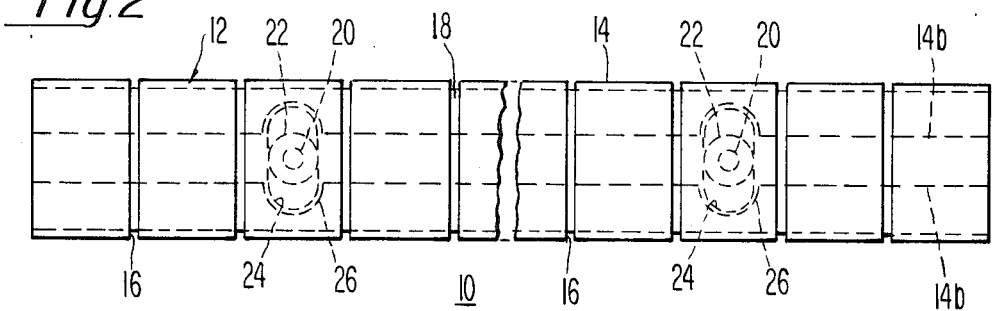
FIG. 2 is a plan view of the double-action gasket assembly of the present invention.
Figure 3:
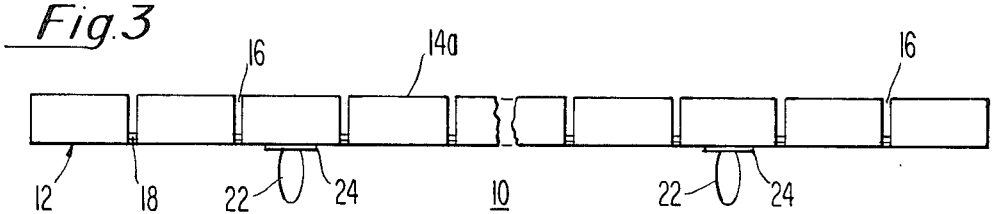
FIG. 3 is a side view of the assembly of FIG. 2.

As seen in FIGS. 2 and 3, the segments 14 of the articulated structure 12 are formed by regularly spaced slits 16 in the structure. The segments 14 as seen particularly in FIG. 4 comprise an arcuate section 14a having opposed extremities bent toward each other to form a respective pair of spaced-apart coplanar sections 14b. The carrier 18 is partially enclosed within the bends of the structure 12 and lies upon the copolanar sections 14b. The carrier includes apertures 20 formed therein for receiving push-in type rivets 22 to mount the gasket assembly 10 to a mounting surface. As seen more clearly in FIG. 4 and FIG. 6, the area of the carrier surrounding the head of a rivet 22 includes a depression 24 to permit the depressed area of the carrier surface to contact the mounting surface (such as 28 or 30 in FIG. 5) and to offset the remaining carrier surface a predetermined distance from the mounting surface. A distance of 0.010 inches has been found to be satisfactory. The offset permits the coplanar sections 14b of the beryllium copper structure 12 to slide against the mounting surface without interference from the carrier 18 when a laterally directed wiping force is applied to the arcuate section 14a. not attached to the carrier 18 except by the shape of its bends between the arcuate section 14a and the coplanar sections 14b. As seen in FIGS. 2 and 6 slots 26 in the last mentioned sections homologous with and partially surrounding the depressions 24 in the carrier 12 provide clearance such that the sections 14b are not captured between the depressions 24 and the mounting surface. This attachment method is loose enough to permit the coplanar sections 14b of structure 12 to slide in either direction when the arcuate section 14a is subjected to wiping forces without being damaged. However, the attachment of the structure 12 to carrier 18 is firm enough to permit routine handling of the assembly 10 without having it come apart.

Figure 5:
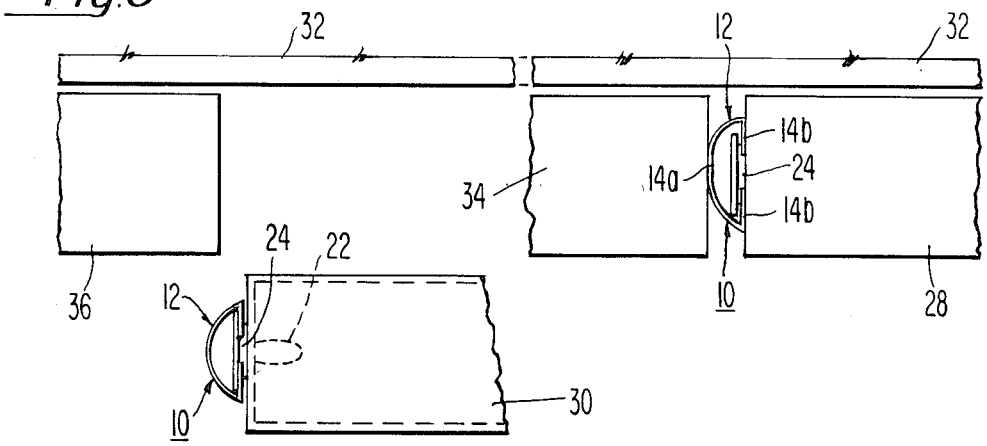
FIG. 5 illustrates the installation of the assembly of the present invention on removable panels of a cabinet frame.
Figure 6:
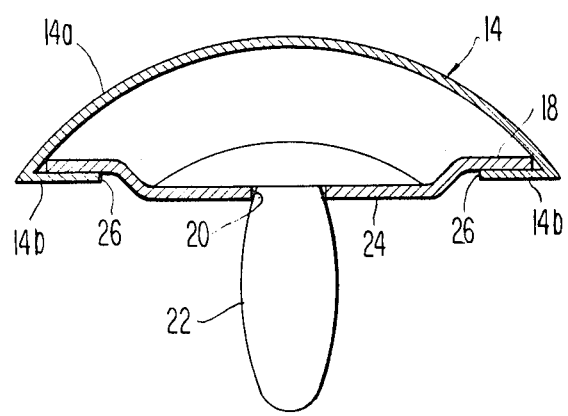
FIG. 6 is a section view of the assembly of FIG. 2.

As seen in FIG. 5, the assembly 10 may be installed on the edges of panels 28 and 30 which are mounted in a frame 32. Panel 34 is assumed to have moved in a direction perpendicular to and toward frame 32 and has compressed the arcuate section 14a of the beryllium copper structure 12, causing the pair of coplanar sections 14b to slide further apart from each other, concurrently moving toward and ultimately contacting the edge mounting surface of panel 28. Since the assembly 10 is capable of double action, panel 34 may wipe the structure 12 in either direction, as during panel installation and removal relative to frame 32, without damage. The structure 12 mounted on panel 30 is in a non-compressed state. Panel 30 may be installed against frame 32, at which time, the adjacent panel 36 will wipe against the structure 12 and the gap formed between adjacent panels will be shielded by the gasket assembly. Since panel flanges are not required with the present assembly, any of the panels 28, 30, 34 or 36 may be individually removed without disturbing the remaining panels.

In conclusion, there has been disclosed an EMI/RFI shielding gasket assembly, characterized in that it is of simple construction and easy to mount, yet effective for its intended purpose; has a double-action capability which not only increases its versatility but also renders it relatively immune to damage during operation and routine handling; and may be installed in adjacent panels of a cabinet enclosure without restricting movement of any panel. It is apparent that depending upon the particular application, changes and modifications of the gasket assembly may be desirable. For example, although beryllium copper has been indicated for the compressive structure, other spring-type electrically conductive materials might be employed. Also, the materials may be plated to minimize corrosion effects. As to the carrier portion of the assembly, although a stainless steel plate 0.625 inches wide by 0.020 inches thick has been used, in an actual operative embodiment of the invention, the carrier may be formed of any rigid material, not necessarily an electrical conductor, and may deviate appreciably from the given dimensions. These and like changes and modifications, insofar as they are not departures from the true scope of the invention, are intended to be covered by the claims which follow.

What is claimed is:

1. An EMI/RFI shielding gasket assembly comprising:

an elongated, articulated structure formed of an electrically conductive material having spring-like properties, said structure having a plurality of segments, each of said segments having an arcuate section with opposed extremities, said extremities being bent toward each other, thereby forming a respective pair of spaced-apart coplanar sections, said segments having an axial space between each extremity and a portion of the arcuate section above the extremity, a rigid, substantially planar carrier having opposing coplanar longitudinal sides, said carrier being substantially enclosed by said segments, and each longitudinal side being disposed adjacent a respective coplanar section, whereby said structure is retained upon said carrier in the presence of wiping compressive forces applies to the arcuate sections of said structure, and a plurality of spacing means for off-setting said longitudinal sides of said carrier from a mounting surface, whereby said pair of coplanar sections are capable of axial movement and contact with said mounting surface in response to said wiping compressive forces.

2. A shielding gasket as defined in claim 1 further characterized in that said means for off-setting said carrier from a mounting surface includes depressions formed in the carrier surface as viewed from the respective interior surfaces of said arcuate sections.

3. A shielding gasket as defined in claim 2 further including means for installing said carrier on a mounting surface proximate with a gap to be shielded.

4. A shielding gasket as defined in claim 3 further characterized in that said carrier includes a plurality of apertures in said depressions, whereby fastening means are accommodated for joining said carrier to the mounting surface.

5. A shielding gasket as defined in claim 4 further characterized in that said pair of coplanar sections include a plurality of slots formed therein and homologously situated with respect to said depressions in said carrier surface, said slots partially surrounding said depressions and providing clearance for said coplanar sections to prevent their capture between said depressions and the mounting surface when said carrier is installed on said last-mentioned surface.

6. A shielding gasket as defined in claim 5 wherein said electrically conductive material of said structure is beryllium copper.

7. A shielding gasket as defined in claim 6 wherein said carrier is formed of stainless steel.

* * * * *